(12) United States Patent
Choi

(10) Patent No.: US 11,881,570 B2
(45) Date of Patent: Jan. 23, 2024

(54) BATTERY CELL INCLUDING ELECTROLYTE ION CONCENTRATION MEASUREMENT UNIT AND METHOD FOR MEASURING ELECTROLYTE CONCENTRATION USING SAME

(71) Applicant: LG CHEM, LTD., Seoul (KR)

(72) Inventor: Soon Ju Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 674 days.

(21) Appl. No.: 17/044,362

(22) PCT Filed: Oct. 21, 2019

(86) PCT No.: PCT/KR2019/013836
§ 371 (c)(1),
(2) Date: Oct. 1, 2020

(87) PCT Pub. No.: WO2020/091283
PCT Pub. Date: May 7, 2020

(65) Prior Publication Data
US 2021/0043987 A1 Feb. 11, 2021

(30) Foreign Application Priority Data
Oct. 31, 2018 (KR) ........................ 10-2018-0131467

(51) Int. Cl.
*H01M 10/48* (2006.01)
*G01R 31/374* (2019.01)
(Continued)

(52) U.S. Cl.
CPC ........ *H01M 10/484* (2013.01); *G01R 31/374* (2019.01); *H01M 10/0585* (2013.01); *H01M 10/48* (2013.01); *H01M 50/569* (2021.01)

(58) Field of Classification Search
CPC ........... H01M 10/484; H01M 10/0585; H01M 10/48; H01M 50/569; H01M 10/0525;
(Continued)

(56) References Cited

U.S. PATENT DOCUMENTS

| 2010/0285349 A1 | 11/2010 | Goto et al. |
| 2013/0295424 A1 | 11/2013 | Knoedgen et al. |
| 2015/0276884 A1 | 10/2015 | Andoh et al. |

FOREIGN PATENT DOCUMENTS

| CN | 103046084 A | 4/2013 |
| CN | 104577236 A | 4/2015 |
(Continued)

OTHER PUBLICATIONS

Office Action dated Aug. 5, 2023 issued in corresponding Chinese Patent Application No. 201980023044.7.
(Continued)

*Primary Examiner* — Cynthia K Walls
(74) *Attorney, Agent, or Firm* — Morgan, Lewis & Bockius LLP

(57) ABSTRACT

The present invention relates to a battery cell including an electrolyte ion concentration measurement unit and a method for measuring an electrolyte concentration using same. The battery cell according to the present invention comprises a measurement unit in which a first electrode plate, an insulation film, and a second electrode plate are sequentially stacked on one another, wherein the measurement unit is inserted between a separator of the battery cell and an electrode thereof, and thus can directly measure an electrolyte concentration between the separator and the electrode. Therefore, the battery cell can be simply manufactured and has excellent stability. In addition, according to the present invention, the method for measuring an electrolyte concentration of a secondary battery using the battery cell enables measurement of electrolyte concentration in real time even during the use of the battery and can measure an electrolyte concentration of the separator more accurately and quickly than a conventional technology.

9 Claims, 3 Drawing Sheets

(51) Int. Cl.
  *H01M 10/0585* (2010.01)
  *H01M 50/569* (2021.01)
(58) Field of Classification Search
  CPC .............. H01M 50/409; H01M 10/052; G01R
       31/374; G01R 31/389; G01N 27/07;
     G01N 27/413; Y02P 70/50; Y02E 60/10
  See application file for complete search history.

(56) References Cited

FOREIGN PATENT DOCUMENTS

| | | |
|---|---|---|
| JP | 4157317 B2 | 10/2008 |
| JP | 2010-170874 A | 8/2010 |
| JP | 2010-218877 A | 9/2010 |
| JP | 5012909 B2 | 8/2012 |
| JP | 2015-187949 A | 10/2015 |
| JP | 2016-031894 A | 3/2016 |
| KR | 20-0288338 Y1 | 9/2002 |
| KR | 10-2010-0098453 A | 9/2010 |
| KR | 10-2017-0033516 A | 3/2017 |
| KR | 10-2017-0065923 A | 6/2017 |
| WO | 2017/171448 A1 | 10/2017 |

OTHER PUBLICATIONS

International Search Report (with parital translation) and Written Opinion issued in corresponding International Patent Application No. PCT/KR2019/013836, dated Jan. 30, 2020.
Extended European Search Report dated Jun. 28, 2021 issued by the European Patent Office in corresponding European patent application No. 19879823.3.

[FIG. 1]
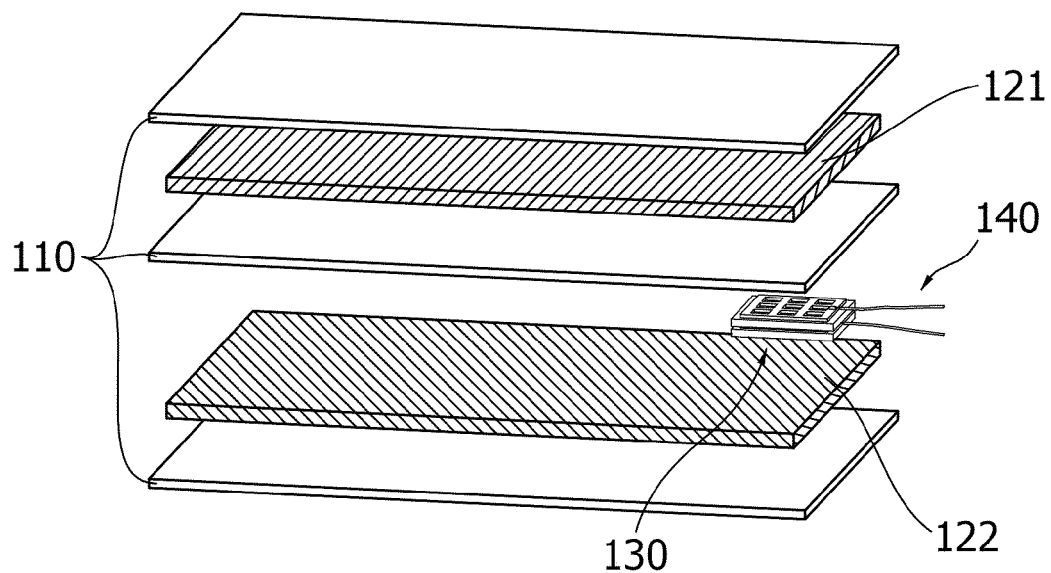

[FIG. 2]
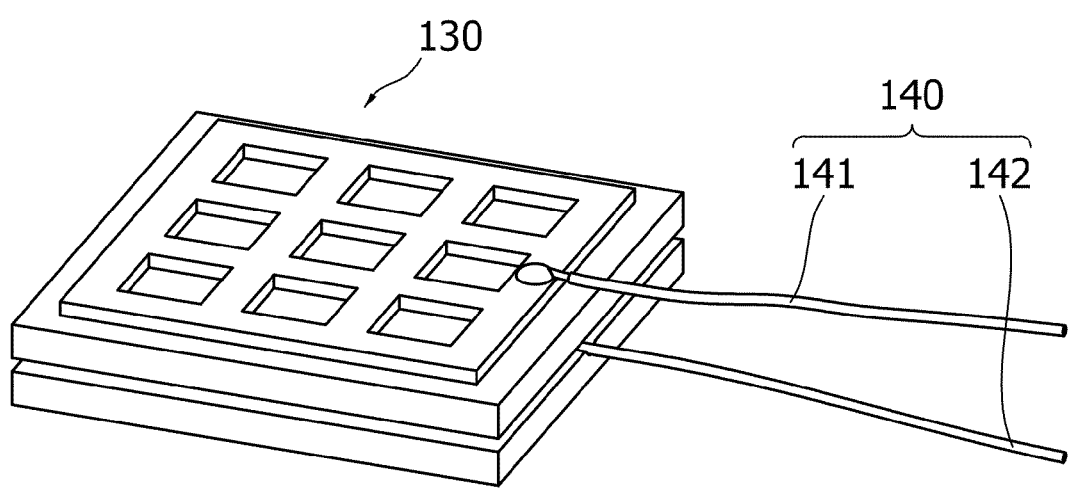

[FIG. 3]
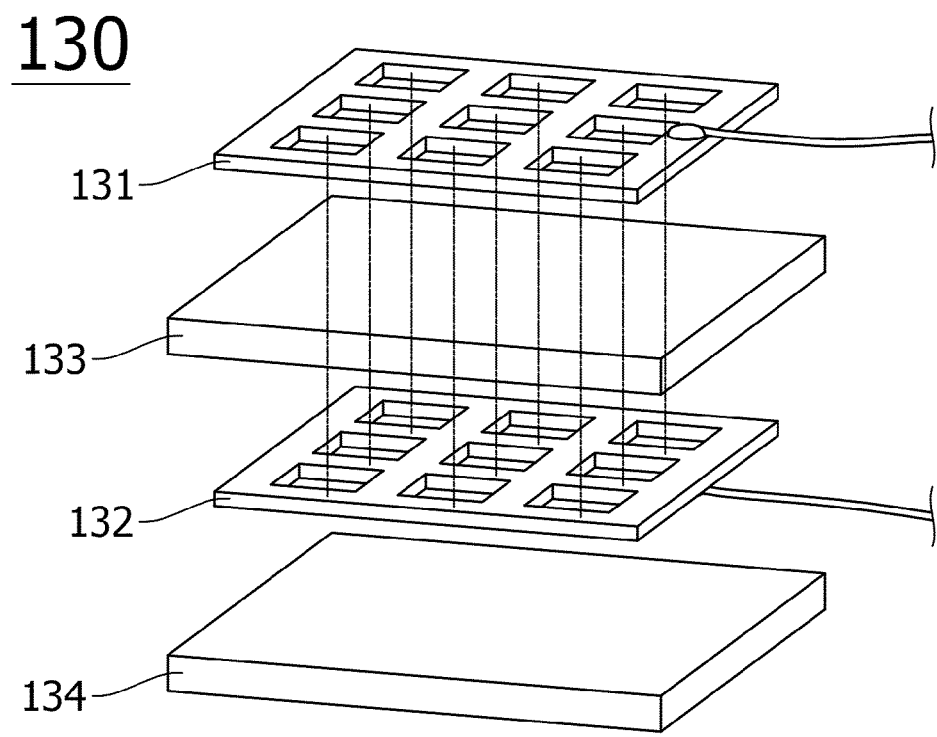
[FIG. 4]
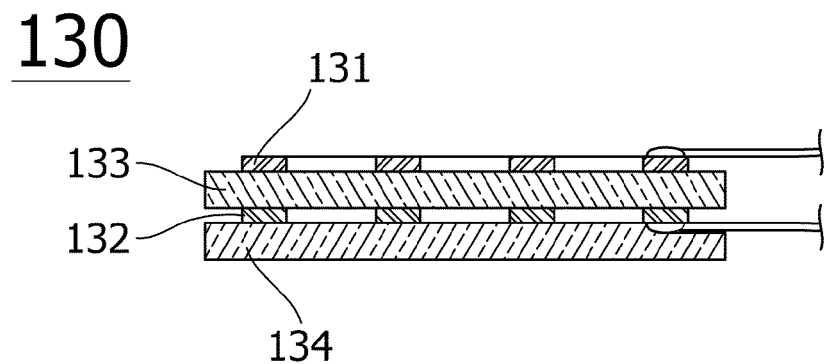

BATTERY CELL INCLUDING ELECTROLYTE ION CONCENTRATION MEASUREMENT UNIT AND METHOD FOR MEASURING ELECTROLYTE CONCENTRATION USING SAME

TECHNICAL FIELD

The present invention relates to a battery cell including an electrolyte ion concentration measuring unit and a method for measuring electrolyte concentration using the same.

This application claims the benefit of priority based on Korean Patent Application No. 10-2018-0131467, filed on Oct. 31, 2018, and the entire contents of the Korean patent application are incorporated herein by reference.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

Generally, in order to prepare a secondary battery, first, a positive electrode and a negative electrode are formed by applying an electrode mixture containing an electrode active material to a surface of a current collector, then a separate is interposed therebetween to thereby make an electrode assembly, which is then mounted in a cylindrical or rectangular metal can or inside a pouch-type case of an aluminum laminate sheet, and a liquid electrolyte is injected or impregnated into the electrode assembly or a solid electrolyte to prepare a secondary battery.

The liquid electrolyte in which the solvent is a liquid in the electrolyte (hereinafter referred to as an "electrolyte") is also commonly referred to as an electrolyte. A nonaqueous electrolyte is generally used as the electrolyte for the lithium secondary battery and is composed of an organic solvent and a salt of an organic or inorganic compound such as $LiClO_4$, $LiBF_4$, $LiPF_6$, $LiAsF_6$, $LiCF_3SO_3$, $LiN(CF_3SO_2)_3$, etc.

The electrolyte for the lithium secondary battery serves to transport lithium ions as a medium for transferring ions of the battery. Therefore, in order to obtain excellent battery performance, it is important to select an electrochemically stable electrolyte having high ion conductivity between both electrodes.

The ion conductivity may be expressed as a sum of cations and anions. Since only lithium cations contribute to the ion conductivity by performing the electrochemical reaction in the lithium secondary battery, the fraction of the cations among all the ions, that is, the cation yield is important. On the other hand, the cation yield generally depends on the concentration of salt, temperature, radius of ions and charge amount in the electrolyte, and is known to be greatly affected by the concentration and temperature of the salt.

However, the electrolyte ion concentration (hereinafter referred to as "electrolyte concentration") of the lithium secondary battery may decrease as the battery deteriorates due to repeated charge/discharge cycles and/or side reactions of the battery. Accordingly, when the ion conductivity is lowered, the lithium ions entering and leaving the two electrodes are not properly transported during charging and discharging, and thus the capacity of the electrode active material cannot be sufficiently realized.

Therefore, it is possible to check the charge/discharge cycle or the battery deterioration state by measuring the electrolyte concentration change, and the electrolyte concentration change value becomes an electrochemical indicator that can measure the overall performance of the secondary battery.

In this regard, conventionally, a method of measuring the concentration of an electrolyte was used. According to the method, after immersing a rod-shaped conductive metal rod in an electrolyte, the resistance value between the wires attached to the rod is calculated, and the electrolyte concentration is estimated by using the temperature data measured by a separate temperature sensor. However, in this method, it was not possible to directly measure the concentration of electrolyte between the electrode and the separator of the battery cell where the lithium ions were transferred due to the size of the conductive metal rod. Only an approximate prediction was possible by an indirect method of immersion in the electrolyte outside the battery cell. In addition, there was a problem in that the change in the electrolyte concentration of the battery could not be measured in real time.

As another method for measuring electrolyte concentration, Korean Laid-Open Patent Publication No. 10-2010-0098453 discloses a lithium ion secondary battery capable of measuring the concentration of lithium ions in an electrolyte at a predetermined site, an assembled battery using the lithium ion secondary battery, a vehicle having the assembled battery and a battery-mounting device, a battery system which can acquire concentration correlation physical quantity in a lithium ion secondary battery, and a method of detecting deterioration of the lithium ion secondary battery. The patent document discloses a method of measuring an electrolyte concentration by interposing a first electrode body portion and a second electrode body portion in a state spaced apart between a separator and an electrode, respectively, as an embodiment. This is a method of reducing the size of a conventional conductive metal bar measuring device and manufacturing it in the form of a thin film, and inserting it into a space between the separator and the electrode to thereby measure the concentration of the electrolyte therebetween. This method has an advantage over the conventional method in which it was difficult to directly measure the electrolyte concentration between the electrode and the separator. However, the measuring method of the patent document is to proceed by inserting the two measuring devices in different positions, respectively. When the inserted measuring devices are in contact with each other to thereby generate a short circuit, not only it is impossible to measure, but it can also cause fever and fire. Therefore, each of the measuring devices should be inserted to be spaced apart by a predetermined interval or more, and there is a constraint that the spaced state should be maintained. In addition, since a separate process of attaching a separate insulating film to the separator is required, the manufacturing method is difficult, and thus there is a limitation in the insertion position and the size of the measuring device. In addition, even if inserted into the battery cell of the measuring device in this way, if the position of the measuring device is changed by an external impact, there is still a risk of heat generation and ignition due to a short circuit, as described above, and thus it may cause a problem of low stability.

DISCLOSURE

Technical Problem

The present invention provides a battery cell including a measuring unit for measuring the electrolyte concentration in measuring the electrolyte concentration of the lithium secondary battery, and a method of measuring the electrolyte concentration using the same.

In this regard, the object of the present invention is to provide a battery cell for measuring secondary battery electrolyte concentration, which is capable of directly measuring electrolyte concentration and performing real-time measurement while using a secondary battery, and is easily manufactured and has a high stability, and a method for measuring electrolyte concentration using the same.

Technical Solution

In order to solve the above problems, a battery cell of the present invention includes a measuring unit in which a first electrode plate, an insulating film and a second electrode plate are sequentially stacked.

The measuring unit may be inserted between a separator and an electrode of the battery cell to thereby measure the electrolyte concentration of the battery cell.

Further, wires drawn to an outside of the battery cell may be connected to the first electrode plate and the second electrode plate, respectively, and the wires may be drawn out the external side of the battery cell to thereby be connected to the resistance measuring device outside the battery cell.

In an embodiment of the present invention, one or more through-holes may be formed on the first electrode plate or the second electrode plate. The measuring unit of the present invention is used to measure the concentration after impregnating the electrolyte in the insulating film interposed between the first electrode plate and the second electrode plate, and when the through-hole is formed on the first electrode plate and the second electrode plate, the electrolyte may be quickly permeated into the measuring unit through the through-hole and be absorbed in the insulating film.

In an embodiment of the present invention, in order to increase the electrolyte impregnation speed, the shapes and/or sizes of through-holes formed on the first electrode plate and the second electrode plate may be set to be the same. In such a case, respective through-holes formed on the first electrode plate and the second electrode plate may be positioned to correspond to each other, and the insulating film impregnation speed of the measuring unit may be more improved.

At this time, a horizontal cross-sectional area of each through-hole may correspond to 0.1 to 45%, more preferably 1 to 10% of a horizontal cross-sectional area of the first electrode plate or the second electrode plate before the through-hole is formed.

Further, as the through-holes are formed on the first electrode plate and the second electrode plate, the porosity of the first electrode plate and the second electrode plate may be 30 to 45%, more preferably 34 to 42%.

Further, the thickness of the measuring unit may be 25 to 35 μm, more preferably 28 to 30 μm.

In an embodiment of the present invention, when the measuring unit is inserted into the battery cell, the first electrode plate or the second electrode plate may be in contact with the electrode of the battery cell, depending on the inserted portion. In such a case, the insulating film may be further included on the outer surface of the first electrode plate or the second electrode.

In an embodiment of the present invention, the first electrode plate and the second electrode plate may be made of one metal selected from the group consisting of aluminum, copper, and nickel or an alloy of two or more kinds thereof, and more preferably be made of aluminum or copper.

In an embodiment of the present invention, the insulating film interposed in the measuring unit may be a porous film of a polyolefin-based polymer material, and the same material as that of the separator of the battery cell may be used.

Meanwhile, the present invention provides a method of measuring electrolyte concentration of a secondary battery by using a battery cell including a measuring unit.

Specifically, a method of measuring electrolyte concentration of a secondary battery according to an embodiment of the present invention may include:

manufacturing a measuring unit in which a first electrode plate, an insulating film and a second electrode plate are sequentially stacked (s1);

connecting an electric wire to one end of the first electrode plate and the second electrode plate (s2);

inserting the measuring unit into a space between the electrode of the battery cell and the separator (s3); and drawing out the electric wire to the outside of the battery cell (s4); and calculating a concentration of electrolyte ions contained in a polymer film by connecting a measuring device to the electric wire (s5).

The electrolyte ion concentration in the step s5 may be calculated by measuring a resistance value between the first electrode plate and the second electrode plate after applying current to the wire and then using a temperature of the electrolyte which is measured by using a separate temperature sen_sor.

In the step s1 of manufacturing the measuring unit, one or more through-holes may be formed on the first electrode plate and the second electrode plate in order to improve the electrolyte impregnation speed.

At this time, a horizontal cross-sectional area of each through-hole may correspond to 0.1 to 45%, more preferably 1 to 10% of a horizontal cross-sectional area of the first electrode plate or the second electrode plate before the through-hole is formed. Further, as the through-holes are formed on the first electrode plate and the second electrode plate, the porosity of the first electrode plate and the second electrode plate may be 30 to 45%, more preferably 34 to 42%. Further, the thickness of the measuring unit may be 25 to 35 μm, more preferably 28 to 30 μm.

Advantageous Effects

The battery cell according to the present invention includes a measuring unit in which the first electrode plate, the insulating film and the second electrode plate are sequentially stacked. The measuring unit is inserted between the separator and the electrode of the battery cell, so it is possible to directly measure the concentration of the electrolyte between the separator and the electrode, and the manufacturing is simple and stability is high.

In addition, according to the secondary battery electrolyte concentration measurement method of the present invention using the battery cell, the electrolyte concentration can be measured in real time even during the use of the battery, and it is possible to measure the electrolyte concentration of the separator more accurately and quickly than in the prior art.

BRIEF DESCRIPTION OF THE DRAWINGS

FIG. 1 illustrates a battery cell structure including an electrolyte concentration measuring unit according to an embodiment of the present invention.

FIG. 2 shows an electrolyte concentration measuring unit and the wire connected to the measuring unit according to an embodiment of the present invention.

FIG. 3 illustrates a structure of an electrolyte concentration measuring unit according to an embodiment of the present invention.

FIG. 4 shows a side cross-sectional view of the electrolyte concentration measuring unit according to an embodiment of the present invention.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

In the present specification, when a part is "connected" to another part, this includes not only "directly connected" but also "electrically connected" between the parts while having another element therebetween.

Also, throughout the specification, when an element is referred to as "including" an element, it is understood that the element may include other elements as well unless specifically stated otherwise.

As used throughout this specification, the terms "about", "substantially", and the like, are used to mean a value or something like this when unique manufacturing and material tolerances are presented, and the terms are used to prevent unscrupulous infringers from unfair use of the disclosure including accurate or absolute figures in order to aid in the understanding of the present disclosure.

Throughout this specification, the term "combination(s) thereof" included in the expression of the Markush form means one or more mixtures or combinations selected from the group consisting of the elements described in the Markush form representation, and it means to include one or more selected from the group consisting of the above components.

Throughout this specification, the expression "A and/or B" means "A or B or both."

Hereinafter, the present invention will be described in detail.

The present invention provides a battery cell for measuring the ion concentration of the electrolyte and a measuring method using the same.

The conventional method of measuring electrolyte concentration using two conductive metal rods has problems that accuracy is low, and electrolyte concentration cannot be measured in real time while using secondary batteries.

In this regard, Korean Patent Laid-Open Publication No. 10-2010-0098453 discloses a technology of manufacturing a conventional measuring device, which is in the form of a rod, in the form of a small thin film and inserting it between an electrode and a separator. However, the manufacturing of the measuring device is difficult and limited, and it does not solve the problem that heat and ignition may occur when a short circuit occurs due to an external shock.

The present invention further improves the conventional secondary battery electrolyte concentration measurement method, and since the distance between the first electrode plate and the second electrode plate of the measuring unit is very small, the magnitude of the resistance value is very small, thereby minimizing the effect of resistance, which is one of the electrolyte concentration measurement variables. As such, the change in electrolyte concentration can be measured more precisely and in real time, compared to Korean Patent Publication No. 10-2010-0098453. That is, the size of the resistance value is small and the sensitivity according to the change of the electrolyte concentration is increased, so that the resolution of the measurement is further increased, thereby enabling accurate concentration change measurement.

In addition, when comparing the present application with the prior art Korea Patent Publication No. 10-2010-0098453, the prior art discloses that each electrode plate is attached to the separator to measure the electrolyte concentration, and an additional insulating film is attached thereon to prevent the short circuit. Therefore, the method requires a complicated and difficult additional process that is different from the conventional battery cell manufacturing process, and is not suitable for mass production, and thus the industrial availability is not high.

On the contrary, the measuring unit according to the present invention can be easily manufactured using a conventional electrode lamination device, and insertion is also very simple. In order to perform insertion, a stacking process is to be temporarily stopped at the desired position during the stacking process of the battery cell, and then the measuring unit is placed in the battery cell and the stacking process is resumed.

In the aspect of effects, the measuring unit of the present invention minimizes the interference of the outside by minimizing the size of the measuring unit by stacking the electrode plates at the time of measurement, and furthermore, it has a minimal effect on the external, that is, the electrode of the battery. In contrast, in the prior art, since two electrode plates are separated and inserted separately, the area occupied by foreign matters between the separators increases, which may cause an increase in resistance during charge and discharge.

In addition, in the case of using a method of attaching to the battery separator of the prior art, since the two current collectors may be short-circuited by being connected to the positive electrode and the negative electrode of the battery, there is a problem that the measurement method may become also difficult. For example, an additional device or process may become necessary for the measurement.

On the other hand, since the measuring unit of the present invention can be easily inserted during the battery cell stacking process after manufacturing and testing in advance as described above, processability is excellent and calibration through pre-test is also possible. That is, the measuring unit according to the present invention is not only easy to manufacture in a simple process, but also easy to install because it is only inserted between the separator and the electrode in a typical battery cell manufacturing process, and precise measurement is possible even without a demanding additional process.

Hereinafter, a battery cell and a method for manufacturing the same according to the present invention, and a method for measuring electrolyte concentration using the battery cell according to the present invention will be described in detail.

The present invention provides a battery cell in which the electrode and the separator are sequentially stacked and is characterized in that, by including a measuring unit for measuring the concentration of the electrolyte therein, the electrolyte concentration between the electrode and the separator can be accurately measured. In addition, in the present invention, the measuring unit is inserted between the electrode and the separator, and the wire drawn out of the battery cell and the completed secondary battery is connected to the measuring unit, thereby allowing the electrolyte concentration to be measured in real time even during use of the battery.

According to a specific embodiment of the present invention, the electrode assembly includes an electrode laminate in which two electrodes having opposite polarities are alternately stacked by interposing a separator therebetween. The electrode may be a negative electrode or a positive electrode, and the separator may be interposed between the positive electrode and the negative electrode to thereby electrically insulate them.

The positive electrode may include, for example, a positive electrode current collector made of aluminum (Al) and a positive electrode active material layer formed by coating a positive electrode active material on one or both surfaces of the positive electrode current collector. Similarly, the negative electrode may include a current collector made of copper and a negative electrode active material layer formed by coating a negative electrode active material on one surface of the current collector.

Layered positive electrode active material such as $LiCoO_2$, $LiNiO_2$, $LiNi_{1-y}Co_yO_2(0<y<1)$, $LiMO_2$(M=Mn, Fe, etc.), $Li(Ni_aCo_bMn_c)O_2(0<a<1, 0<b<1, 0<c<1, a+b+c=1)$, $LiNi_{1-y}Mn_yO_2(0≤y<1)$; spinel type positive electrode active material such as $LiMn_2O_4$, $LiMn_{2-z}Co_zO_4(0<z<2)$, $LiMn_{2-z}Ni_zO_4(0<z<2)$, $Li(Ni_aCo_bMn_c)O4(0<a<2, 0<b<2, 0<c<2, a+b+c=2)$; olivin type positive electrode active material such as $LiCoPO_4$ and $LiFePO_4$, etc. may be used as the positive electrode active material.

Carbonaceous material such as petroleum coke, activated carbon, graphite, non-graphitized carbon, graphite carbon; metal complex oxide of $LixFe_2O_3(0≤x≤1)$, $Li_xWO_2$ $(0≤x≤1)$, $Sn_xMe_{1-x}Me'_yO_z$ (Me: Mn, Fe, Pb, Ge; Me': Al, B, P, Si, group 1, 2, and 3 elements of the periodic table, halogen; $0<x≤1$; $1≤y≤3$; $1≤z≤8$); lithium metal; lithium alloy; silicon-based alloy; tin alloy; oxide such as SnO, $SnO_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, $Bi_2O_5$; conductive polymer such as polyacetylene; Li—Co—Ni-based material, etc.

In the present invention, the electrode tab of the negative electrode tab or positive electrode tab may be formed for the negative electrode and the positive electrode, respectively. The electrode tab may be formed integrally with the negative electrode current collector and/or the positive electrode current collector, for example, and corresponds to a non-coated region where the electrode active material is not coated. That is, the electrode tab T may be formed by punching a region corresponding to a region where the electrode active material is not coated on the surface of the current collector to be formed into an appropriate shape.

In one specific embodiment of the present invention, the separator serves as an ion conductive barrier for passing ions while blocking electrical contact between the negative electrode and the positive electrode. According to one specific embodiment of the present invention, the separator may include a porous polymer substrate having a plurality of micropores. Furthermore, the separator may have a porous coating layer including a plurality of inorganic particles and a polymer binder resin on the surface of the porous polymer substrate. The porous coating layer is a layer in which inorganic particles are bonded by point bonding and/or surface bonding through a binder resin, and the coating layer has a porous structure due to the interstitial volume between the inorganic particles.

The porous polymer substrate may be made of at least one of polymer resins such as polyolefin, polyethylene terephthalate, polybutylene terephthalate, polyacetal, polyamide, polycarbonate, polyimide, polyetheretherketone, polyethersulfone, polyphenylene oxide, polyphenylene sulfide, and polyethylene naphthalene, but is not particularly limited thereto. In addition, any of a sheet-like film, in which a polymer resin is melted and formed into a film, and a nonwoven fabric, in which filaments obtained by melting and spinning a polymer resin are integrated, may be used as the porous polymer substrate. Preferably it is a porous polymer substrate prepared in the form of a sheet by melting/molding the polymer resin.

Referring to FIG. 1, the battery cell 100 according to an embodiment of the present invention may include a measuring unit 130 for measuring the electrolyte concentration between the positive electrode 121 and the separator, or between the negative electrode 122 and the separator 110. The measuring unit 130 is characterized in that the wire 140 drawn out of the battery cell 100 is connected.

Referring to FIGS. 2 and 3, the measuring unit 130 has an insulating film 133 interposed between the first electrode plate 131 and the second electrode plate 132, and they are sequentially stacked. On the other hand, a wire 140 connected to the measuring unit includes a wire 141 connected to the first electrode plate 131 and a wire 142 connected to the second electrode plate 132, respectively, and the wire 140 is drawn out of the battery cell as shown in FIG. 1.

The measuring unit is inserted between the electrode and the separator 110 of the battery cell 100 to measure the concentration of the electrolyte between the separator and the electrode. According to the exemplary embodiment of FIG. 1, the measuring unit is illustrated as being inserted between the negative electrode 122 and the separator 110, but may be inserted between the positive electrode 121 and the separator 110. In this case, the measuring unit does not necessarily need to be inserted between the electrode and the separator of the battery cell, and may be inserted at another position that can be inserted according to the size, shape, and structure of the battery cell.

As shown in FIG. 1, according to an embodiment of the present invention, the insulating layer 133 of the measuring unit is interposed between the first electrode plate 131 and the second electrode plate 132 to absorb the electrolyte between the positive electrode 121 or the negative electrode 122 of the battery cell and the separator 110, and when a current is applied to the wire 140 connected to the first electrode plate 131 and the second plate 132, the resistance value may be measured to calculate the concentration of the electrolyte. On the other hand, the wires are drawn out after assembling the secondary battery, and it is possible to measure the real-time electrolyte concentration at any time even while using the battery.

The insulating film 133 may be made of a porous film made of a polyolefin-based polymer material so that the first electrode plate 131 and the second electrode plate 132 may be electrically insulated, and the electrolyte may be easily absorbed and lithium ions may be moved smoothly. Further, the used material may be the same material used for the separator. In addition, when a short circuit is expected according to the insertion part of the measuring unit, it is also possible to attach an additional insulating film 134 to the outer surface of the electrode plate that needs to be electrically insulating as shown in FIGS. 3 and 4.

Meanwhile, the first electrode plate and/or the second electrode plate may have a through-hole having a columnar shape, as shown in one embodiment of FIGS. 2 to 4. In this case, as shown in FIG. 3, when the through-holes formed in the first electrode plate and the second electrode plate are positioned so that their shape and position correspond to each other in a direction perpendicular to the electrode plate, the electrolyte on the outside of the measuring unit is more easily penetrated inside through the through hole. As a result, the electrolyte is quickly absorbed into the insulating film, whereby the concentration change of the electrolyte can be measured more quickly in real time.

To this end, the through-hole may have a minimum size to easily penetrate the electrolyte, but if the through-hole is too small, it may be difficult to form the through-hole by conventional equipment. Therefore, when considering the efficiency of the manufacturing process, each of the through-holes preferably occupies 0.1% or more relative to the horizontal cross-sectional area of the first electrode plate and/or the second electrode plate before forming the through-hole.

In addition, one or more through-holes may be formed in the electrode plate, and the porosity of the electrode plate is determined according to the size and number of the through-holes. The porosity of the electrode plate is a value obtained by dividing the sum of the volumes of all the through-holes formed by the volume of the electrode plate before forming the through-holes, and the porosity of the electrode plate is preferably adjusted to a range similar to that of the insulating film absorbing the electrolyte. Specifically, the porosity of the electrode plate is preferably adjusted to have a porosity of 30 to 45%, and more preferably adjusted to have a porosity of 34 to 42%.

On the other hand, in order to increase the electrolyte impregnation speed, it is preferable to form the through-hole in the form of a column having a constant diameter. In this case, the porosity of the electrode plate may be calculated as a value obtained by dividing the horizontal cross-sectional area of the through-hole by the horizontal cross-section of the electrode plate.

Therefore, when only one through-hole is formed, it is preferable that the horizontal cross-sectional area of the through-hole does not exceed 45% of the electrode plate area. Even if it exceeds 45%, it is difficult to expect further improvement of electrolyte permeability, and if the through-hole is formed too large, the rigidity of the electrode plate may be deteriorated, which may cause a defect such as distortion during preparing a measuring unit or during inserting the battery cell.

On the other hand, according to the experiments of the present applicant, in the case of the electrode plate having the same porosity, the penetration rate is more excellent when a plurality of through-holes are formed than when one through-hole is formed. Therefore, it is preferable to form two or more through-holes, and when considering the efficiency of the process and the excellent penetration rate, it is most preferable to form a plurality of through-holes having a horizontal cross-sectional area of 1 to 10% of the electrode plate area so that the porosity of the electrode plate becomes 30 to 45%.

As described above, when the porosity of the first electrode plate and/or the second electrode plate is preferably set to be 30 to 45%, more preferably 34 to 42% by one or more through-holes formed in the first electrode plate and/or the second electrode plate, excellent electrolyte penetration rate can be expected. However, if the porosity exceeds 45%, it is difficult to obtain uniform quality during the manufacturing process, and the difficulty of manufacturing can increase rapidly by generation of defects, etc., which is not desirable in terms of securing the efficiency of the process, and in such a case, it is difficult to expect significant improvement in penetration rate. On the other hand, when the porosity is less than 30%, the electrolyte penetration rate is lowered, which is not preferable.

According to an embodiment of the present invention, the thickness of the measuring unit of the present invention may be preferably 25 to 35 μm, more preferably 28 to 30 μm. The thickness of the measurement unit is preferably as thin as possible because it does not change the shape of the battery cell even after insertion. However, when the thickness is too thin below the above range, the mechanical strength of the measuring unit may be lowered, such that the measuring unit may be broken due to external impact or the laminated structure may be distorted during manufacturing.

On the other hand, when the measuring unit of the present invention is inserted between the electrode and the separator, one outer surface of the first electrode plate or the second electrode plate comes in contact with the electrode. In this case, the insulating layer 134 may be further provided on an outer surface of the electrode plate which is in contact with the electrode, thereby adding insulation.

The first electrode plate and the second electrode plate may be made of one metal selected from the group consisting of aluminum, copper, and nickel or an alloy of two or more kinds thereof, and more preferably be made of aluminum or copper.

The method for measuring the electrolyte concentration using the battery cell including the measuring unit of the present invention may include the following steps:

manufacturing a measuring unit in which a first electrode plate, an insulating film and a second electrode plate are sequentially stacked (s1);

connecting an electric wire to one end of the first electrode plate and the second electrode plate (s2);

inserting the measuring unit into a space between the electrode of the battery cell and the separator (s3);

drawing out the electric wire to the outside of the battery cell (s4);

calculating a concentration of electrolyte ions contained in a polymer film by connecting a measuring device to the electric wire (s5).

The concentration of the electrolyte is usually proportional to the magnitude of the electrical conductivity and inversely proportional to the resistance value. In addition, electrical conductivity is greatly affected by temperature. Based on these characteristics, a unique temperature curve according to the electrical conductivity and concentration characteristics appears depending on the type of electrolyte.

The electrolyte measurement principle of the present invention uses the above-described electrolyte concentration characteristic, and in step s5, the resistance value between the first electrode plate and the second electrode plate can be measured by applying a current to the wire, from which the approximate concentration of the electrolyte can be calculated. After measuring the temperatures of the electrolyte, and then the measured temperatures can be amended to an inherent temperature curve according to the type of electrolyte, to thereby obtain a precise electrolyte concentration measurement results. In this case, a temperature sensor may be separately installed for measuring the electrolyte temperature.

Meanwhile, in the step s1, through holes may be formed in the first electrode plate and/or the second electrode plate to improve electrolyte permeability, and as described above, the porosity of the electrode plate is determined by the sum of the horizontal cross-sectional areas of the through holes with respect to the horizontal cross-sectional area of the electrode plate. Hence, the horizontal cross-sectional area of each individual through hole is preferably in the range of 0.1 to 45% relative to the total area of the electrode plate prior to through hole formation.

The measuring unit of the present invention is a stack of the first electrode plate, the insulating film, and the second electrode plate in sequence, and may further include an insulating film on the outer surface of the electrode plate in contact with the electrode of the battery cell. In this case, the total thickness of the measuring unit may be preferably 25 to 35 µm, more preferably 28 to 30 µm.

Hereinafter, the manufacturing method of the battery cell including the measuring unit according to the present invention will be described in detail.

Manufacture of the First Electrode Plate and the Second Electrode Plate

First, a metal foil to be used as the first electrode plate and the second electrode plate is cut. Since the first electrode plate and the second electrode plate correspond to the size of the measuring unit, first, the type and the insertion site of the battery cell into which the measuring unit is to be inserted may be determined, and then may be appropriately adjusted and cut to an appropriate size for easy insertion. In this case, copper may be used as the metal foil material, but other metals such as aluminum and nickel may be used.

Next, a through hole is formed in the cut metal foil. The through hole can be adjusted in size in consideration of electrolyte penetration rate and stability of the electrode plate, and the shape of the through hole may be preferably in the form of a square column, but if the diameter is uniform, it may be manufactured in another column shape such as a cylinder or a triangular column.

Preparation of Insulating Film

The insulating film used in the measuring unit may be manufactured by cutting the porous polymer material into sizes corresponding to the first electrode plate and the second electrode plate, and the same material as that used for the separator of the battery cell may also be used. At this time, the binder is applied to both surfaces of the insulating film to a thickness of 3 to 5 µm so that each of the first electrode plate and the second electrode plate can be attached to the insulating film. At this time, if the thickness of the binder is too thin outside the above range, the stability of the measuring unit may be lowered. If the binder is too thick, the thickness of the whole measuring unit may be thickened. As such, when the binder is inserted into a battery cell the shape of the battery cell may be deformed.

Manufacture of Measuring Unit

The first electrode plate and the second electrode plate are positioned on one surface and the other surface of the insulating film, respectively. At this time, when the through-holes formed in the first electrode plate and the second electrode plate are positioned to correspond to each other in the vertical direction perpendicular to the electrode plate, the electrolyte penetration rate is improved, so that the concentration changes in real time can be measured more quickly.

As described above, after forming a laminate such as a sandwich in the order of the first electrode plate, the insulating film, and the second electrode plate, a pressing step is performed. At this time, since the laminate is torn or distorted due to pressure, it is preferable to carry out the pressing process after wrapping the laminate with a film that protects the surface of the laminate, preferably a PET film. At this time, the pressurizing process of applying pressure to the laminate is the same as the lamination process of conventional battery manufacturing. Thereafter, the film surrounding the surface of the pressed laminate is separated to prepare a measuring unit according to the present invention.

On the other hand, since a short circuit may occur when the electrode plate of the measuring unit contacts the electrode or the like, depending on the insertion part of the battery cell, an insulating film may be additionally attached to the outer side of the electrode plate to prevent the short circuit.

Wire Connection

Wires made of copper and/or other conductive materials are connected to the first and second electrode plates, respectively. The wire is inserted into the battery cell while being connected to the measuring unit, and depending on the insertion site, the wire may cause a short circuit in the battery cell. Therefore, when it is necessary to give insulation to the wire, it can be coated with an insulating material. The wire is drawn out and connected to a measuring device for measuring the resistance of the electrolyte.

Manufacture of Battery Cell and Insertion of Measuring Unit

Production of the battery cell may be performed in the same manner as a conventional manufacturing process. However, when the measuring unit according to the present invention is inserted into the battery cell, it is preferable that the battery cell is made during the stacking step of the battery cell manufacturing process. When the insertion position of the measuring unit is determined, the stacking process can be temporarily suspended, the measuring unit can be placed at a desired position, and then the insertion can be simply performed by resuming the stacking process to cover the measuring unit.

Drawing Out and Sealing of Electric Wire

The measuring unit is positioned between the separator and the electrode of the battery cell, and then the wire is drawn out to the outside. After drawing the wire to the outside, it is possible to seal by attaching the polymer film on the area opened by the insertion of the measuring unit and applying heat to the area, thereby maintaining a sealed state so that outside air does not flow into the inside.

Meanwhile, with respect to battery elements, for example, binders, which are not described in detail herein, reference may be made to elements commonly used in the battery field, particularly in the lithium secondary battery field.

Hereinafter, the present invention will be described in detail with reference to examples. However, the embodiments according to the present invention may be modified into various other forms, and the scope of the present invention should not be construed as being limited to the examples described below. The examples of the present invention are provided to more fully describe the present invention to those skilled in the art.

EXAMPLE 1

Preparation of the First Electrode Plate and the Second Electrode Plate

A first electrode plate and a second electrode plate having a square shape of 30 mm in width and 30 mm in length were prepared. Both the first electrode plate and the second electrode plate were used by cutting a foil of copper material having a thickness of 6 μm.

Nine identical through holes were formed in the shape of square columns at equal intervals using a pressure punching equipment on the first electrode plate and the second electrode plate. The horizontal cross-sectional area of each of the individual through holes is a square shape of 6 mm in width and 6 mm in length, and each of the through holes is spaced apart from each other by 4 mm in the horizontal and vertical directions.

Preparation of Insulating Film

The insulating film has a square shape of 35 mm in width and 35 mm in length, and a porous polyethylene material having a porosity of 41% was used. The thickness of the insulating film was 9 μm, and a binder was coated on both surfaces of the insulating film to form a binder layer having a thickness of 4 μm, respectively.

Manufacture of Measuring Unit

A laminate was formed by adjusting the positions such that the through-holes formed in the first electrode plate and the second electrode plate correspond to each other in a direction perpendicular to the electrode plate while the insulating film is laminated so as to be interposed between the first electrode plate and the second electrode plate.

After wrapping the laminate with a PET film, it was pressurized using an electrode lamination device, and a wire of copper material was connected to the first electrode plate and the second electrode plate, respectively, to thereby prepare a measuring unit according to the present invention. The thickness of the prepared measuring unit was 29 μm, and the porosity of each electrode plate was 36% (horizontal cross section area of the through hole (6 mm*6 mm)*9/horizontal cross section area of the electrode plate (30 mm*30 mm)).

EXAMPLE 2

The measuring unit was manufactured in the same manner as in Example 1 except that nine equal through holes are generated in the first and second electrode plates so that the horizontal cross-section of each individual through hole becomes a square shape of 2 mm in width and 2 mm in length, and each through hole is spaced 8 mm apart in the transverse and longitudinal directions. The thickness of the prepared measuring unit was 29 μm, and the porosity of the electrode plate was 4%.

EXAMPLE 3

The measuring unit was manufactured in the same manner as in Example 1 except that a single through hole was created at the center of the first electrode plate and the second electrode plate so that the horizontal cross-section of each individual through hole became a square shape having a width of 18 mm and a length of 18 mm. The thickness of the prepared measuring unit was 29 μm, and the porosity of each electrode plate was 36%.

COMPARATIVE EXAMPLE 1

A measuring unit was manufactured in the same manner as in Example 1, except that neither the first electrode plate nor the second electrode plate formed a through hole. The thickness of the prepared measuring unit was 29 μm, and the porosity of each electrode plate was 0%.

The difference of the measuring unit manufactured by each said Example and the comparative example is shown in Table 1 below.

TABLE 1

| Division | Whether through-hole is formed | Through hole size | No. of through holes | Porosity |
| --- | --- | --- | --- | --- |
| Example 1 | ○ | width, length 6 mm | 9 | 36% |
| Example 2 | ○ | width, length 2 mm | 9 | 4% |
| Example 3 | ○ | width, length 18 mm | 1 | 36% |
| Comparative Example 1 | X | — | 0 | 0% |

EXPERIMENTAL EXAMPLE 1

Measurement of Easiness of Electrolyte Penetration

In order to compare the electrolyte impregnation performance of the measuring unit manufactured by each of the above Examples and Comparative Examples, a comparative experiment about the ease of penetration of the electrolyte was carried out.

First, the measuring unit according to the above Examples and Comparative Examples is prepared and sufficiently dried at room temperature, and then resistance measurement was started by connecting a resistance measuring device to the wire connected to the measuring unit.

Thereafter, the measuring unit was impregnated in an electrolyte having an ion concentration of 0.5 M which is prepared by dissolving $LiPF_6$ in a co-solvent which is generated by mixing ethyl carbonate (EC) with ethyl methyl carbonate (EMC) in a 1:1 ratio for each of the measuring devices.

The time was measured from right after the impregnation of the measuring unit until the resistance value is displayed as 1.98Ω, which is the resistance value of the 0.5 M concentration electrolyte, and the result was shown in Table 2 below.

TABLE 2

| Division | Whether through-hole is formed | Through hole size | No. of through holes | Porosity | Max. penetration distance | Penetration time |
|---|---|---|---|---|---|---|
| Example 1 | ○ | width, length 6 mm | 9 | 36% | 2 mm | 0.8 sec. |
| Example 2 | ○ | width, length 2 mm | 9 | 4% | 4 mm | 3.4 sec. |
| Example 3 | ○ | width, length 18 mm | 1 | 36% | 6 mm | 7.1 sec. |
| Comparative Example 1 | X | — | 0 | 0% | 15 mm | 62 sec. |

In Table 2, the maximum penetration distance is a value obtained by dividing the minimum length of the portion of the insulating film covered by the electrode plate in half. For example, in Example 1, since the through holes are 4 mm apart from each other, the minimum length of the insulating film covered by the electrode plate is 4 mm, and the maximum penetration distance divided by ½ is 2 mm. In general, the electrolyte penetration rate is better when the maximum penetration distance is shorter.

Looking at the measurement results, in the case of Example 1, the penetration time was the best result of 0.8 seconds. On the other hand, in the case of Example 2, even though there are nine through-holes as in Example 1, the penetration time was 3.4 seconds, which is significantly slower than in Example 1 even in view of the difference in the maximum penetration distance. In the case of Example 2, the porosity is only 4%, which seems to be because the movement of the electrolyte is inhibited.

However, in Example 3 having the same porosity as Example 1, the penetration time was 7.1 seconds, which is slower than that of Example 2. As such, it can be seen that even when having the same porosity, the more the through-holes having a uniform pattern, the better the penetration rate.

On the contrary, it can be seen that in Comparative Example 1, in which the through hole is not formed, the penetration time is significantly longer than in Examples 1 to 3.

Through the above results, it can be seen that the penetration time can be further improved depending on the porosity and the method of forming the through holes. At this time, it is expected that when the porosity is preferably in the range of 30 to 45%, more preferably 34 to 42% similar to the range of the insulating film of the porous material, the penetration rate will be excellent.

In addition, when the porosity is the same, the smaller the size of the through hole is and the more the through holes are formed as plural, the more advantageous. However, if the size of the through hole is too small, the electrolyte becomes difficult to move through the through hole, and it may be difficult to manufacture with conventional equipment. Therefore, the horizontal cross-sectional area of each individual through hole is preferably 0.1% or more relative to the area of the electrode plate. In addition, a significant increase of the penetration effect is not expected when it exceeds 45% of the electrode plate area. Rather, as the rigidity of the measuring unit is lowered, there is a possibility that a defect may occur during manufacturing. Therefore, it is desirable to be within 45%.

As shown in Table 2, in the case of Example 1 in which nine through-holes having a through-hole horizontal cross-sectional area of 4% of the electrode plate area are formed, it can be seen that the penetration rate is excellent.

EXPERIMENTAL EXAMPLE 2

On the other hand, in the measurement of the electrolyte concentration changes in real time, in order to verify the effect of the measuring unit according to the present invention, the following additional experiment was conducted.

The measuring unit of each of the above Examples and Comparative Examples, which was sufficiently immersed in the same electrolyte solution and displayed a resistance of 1.98Ω by performing experimental example 1 is immersed in the electrolyte which consists of the same component of 1.0M ion concentration. Then, the time taken for the measured resistance value to be changed from 1.98Ω to 1.32Ω corresponding to the resistance value of the 1.0M electrolyte was measured, and the results are shown in Table 3 below.

TABLE 3

| Division | Whether through-hole is formed | Through hole size | No. of through holes | Porosity | Max. penetration distance | Reaction time |
|---|---|---|---|---|---|---|
| Example 1 | ○ | width, length 6 mm | 9 | 36% | 2 mm | 0.9 sec. |
| Example 2 | ○ | width, length 2 mm | 9 | 4% | 4 mm | 4.5 sec. |
| Example 3 | ○ | width, length 18 mm | 1 | 36% | 6 mm | 8.9 sec. |
| Comparative Example 1 | X | — | 0 | 0% | 15 mm | 77.3 sec. |

As shown in Table 3, in the case of Example 1, it takes only 0.9 seconds to reflect the change in the electrolyte concentration in the measured value, from which it can be seen that the real-time electrolyte concentration can be measured substantially.

DESCRIPTION OF REFERENCE NUMERALS

100: battery cell
110: separator
121: positive electrode
122: negative electrode
130: measuring unit
131: first electrode plate
132: second electrode plate
133: insulating film
140: electric wire
141: electric wire connected to a first electrode plate
142: electric wire connected to a second electrode plate

The invention claimed is:

1. A battery cell including a measuring unit in which a first electrode plate, an insulating film and a second electrode plate are sequentially stacked,
   wherein the measuring unit is located between a separator and an electrode of the battery cell, and
   wherein the measuring unit comprises at least two wires drawn to an outside of the battery cell, wherein one of the wires is connected to the first electrode plate, and the other wire is connected to the second electrode plate.

2. The battery cell of claim 1, wherein the first electrode plate or the second electrode plate comprises one or more through-holes.

3. The battery cell of claim 2, wherein, when both the first electrode plate and the second electrode plate comprise the one or more through-holes, the through-holes of the first electrode plate and the second electrode plate have a same shape.

4. The battery cell of claim 2, wherein a horizontal cross-sectional area of each through-hole corresponds to 0.1 to 45% of a horizontal cross-sectional area of the first electrode plate or the second electrode plate.

5. The battery cell of claim 1, wherein a porosity of the first electrode plate and the second electrode plate is 30 to 45%.

6. The battery cell of claim 1, wherein a thickness of the measuring unit is 25 to 35 $\mu M$.

7. The battery cell of claim 1, wherein the measuring unit further comprises an additional insulating film on an outer surface of the first electrode plate or the second electrode plate in contact with the electrode.

8. The battery cell of claim 1, wherein the first electrode plate and the second electrode plate comprise one metal or an alloy of two or more metals selected from the group consisting of aluminum, copper and nickel.

9. The battery cell of claim 1, wherein the insulating film is comprises a material that is included in the separator of the battery cell.

* * * * *